United States Patent [19]

Johnson et al.

[11] 4,075,612

[45] Feb. 21, 1978

[54] ROUNDED SERRATED EDGE FILM STRIP GEOMETRY FOR CROSS-TIE WALL MEMORY SYSTEM

[75] Inventors: Leslie Harold Johnson, Minneapolis; David Shih-Fang Lo, Burnsville; Maynard Carlton Paul, Bloomington, all of Minn.

[73] Assignee: Sperry Rand Corporation, New York, N.Y.

[21] Appl. No.: 756,223

[22] Filed: Jan. 3, 1977

[51] Int. Cl.² ............................................. G11C 19/08
[52] U.S. Cl. ...................................... 365/171; 365/35
[58] Field of Search ................................. 340/174 TF

[56] References Cited

PUBLICATIONS

AIP Conference on Magnetism & Magnetic Materials, Dec. 9-12, 1975, pp. 624–625.
IEEE Transactions on Magnetics, vol. Mag-10, 1974, pp. 564–566.

Primary Examiner—James W. Moffitt
Attorney, Agent, or Firm—Kenneth T. Grace; William E. Cleaver; Marshall M. Truex

[57] ABSTRACT

The design of a magnetic film strip for defining the data track of a cross-tie wall memory system is disclosed. The design involves the conformation or shaping of the opposing edges of the film strip into repetitive, rounded, asymmetrical serrated edge contours. The serrated edge shape structures the cross-tie of each cross-tie, Bloch-line pair at the narrowest width dimension across the film strip while the Bloch-line is positioned at the widest width dimension across the film strip or at the round, convex, portion of the repetitive serrated edge shape. The asymmetrical, rounded edge contour is substantially in alignment with the natural contour of the magnetization that is oriented around a Bloch-line that is positioned on the cross-tie wall, which cross-tie wall is aligned along and superposed the geometric centerline of the film strip.

3 Claims, 6 Drawing Figures

ROUNDED SERRATED EDGE FILM STRIP GEOMETRY FOR CROSS-TIE WALL MEMORY SYSTEM

The invention described herein was made in the course of, or under, a contract with the Department of the Navy.

BACKGROUND OF THE INVENTION

The propagation of inverted Néel wall sections instead of magnetic bubbles in a serial access memory system was proposed by L. J. Schwee, et al in the publication "Proposal On Cross-Tie Wall and Bloch-line Propagation In Thin Magnetic Films," IEEE Transactions On Magnetics, MAG 8, No. 3, pages 405 – 407, September 1972. Such a memory system utilizes a ferromagnetic film of 81% Ni - 19% Fe approximately 350 Angstroms (A) thick in which cross-tie walls can be changed to Néel walls and Néel walls can be changed to cross-tie walls by applying appropriate fields. Associated with the cross-tie wall is a section of inverted Néel wall that is bounded by a cross-tie on one end and a Block-line on the other end.

In such a cross-tie wall memory system, information is entered at one end of the serial access memory system by the generation of an inverted Néel wall section, bounded by a cross-tie on one side and a Block-line on the other side, that is representative of a stored binary 1, and a non-inverted Néel wall sections, i.e., the absence of a cross-tie, Bloch-line pair, that is representative of a stored binary O. The inverted Néel wall section is moved or propagated along the cross-tie wall by the successive generation and then the selective annihilation of inverted Néel wall sections at successive memory cells along the cross-tie wall.

In the D. S. Lo, et al, U.S. Pat. No. 3,906,466 there is disclosed a propagation circuit for the transfer of inverted Néel wall sections at successive memory cells along the cross-tie wall. In the L. J. Schwee U.S. Pat. No. 3,868,660 and in the publication "Cross-tie Memory Simplified By The Use of Serrated Strips," L. J. Schwee, et al, AIP Conference Proceedings, No. 29, 21st Annual Conference On Magnetism and Magnetic Materials, 1975, published April 1976, pages 624 – 625, there have been published some more recent results of the further development of cross-tie wall memory systems.

In prior art cross-tie wall memory systems, the magnetic film that functions as the storage medium has the property of uniaxial anisotropy provided by its easy axis induced magnetic fields, which easy axis is created in the magnetic film in its generation during the vapor deposition process. This easy axis provides a magnetic field induced anisotropy which constrains the generation of the cross-tie wall along and parallel to the easy axis. In the above L. J. Schwee, et al, publication there are proposed serrated strips of Permalloy film, about 350 Angstroms (A) in thickness and 10 microns ($\mu$m) in width, which serrated strips are etched from a planar layer of the magnetic material so that the strips are aligned along the easy axis of the film. After an external magnetic field is applied normal to the strip length, i.e., transverse the easy axis of the film, the magnetization along the opposing serrated edges rotates back to the nearest direction that is parallel to the edge. This generates two large domains that are separated by a domain, or cross-tie, wall that is formed along the centerline of the strip. Cross-ties are formed at the necks of the serrated edges while Block-lines are formed in the potential wells between adjacent necks.

This serrated strip configuration, because of the contour of the opposing edges of the strip, provides the means whereby the cross-tie, Block-line pairs are structured at predetermined memory sections along the strip. However, such serrated strips, because of their sharp, angular design, are susceptible to the generation of undesirable magnetic domain walls that inhibit the propagation of the cross-tie, Bloch-line pairs along the data track. Accordingly, it is desirable that there be provided strips of Permalloy that have an edge conformation that structures the positions of cross-tie, Blochline pairs along the data track defining strip while avoiding the generation of undesirable magnetic domain walls as does the serrated strip of L. J. Schwee, et al.

SUMMARY OF THE INVENTION

The present invention relates to the design of the edge contour of a film strip of, e.g., Permalloy film of approximately 350 A in thickness and approximately 10 $\mu$m in width. The edge contours are mirror images, one of the other, of asymmetrical, repetitive patterns of rounded edge portions. The edge contour of each opposing pair of rounded edge portions is substantially in alignment with the natural contour of the magnetization that is oriented around a Block-line, which Bloch-line is positioned along the cross-tie wall that is oriented along the geometric centerline of the film strip. The neck or narrowest point of the edge contour between adjacent rounded edge portions functions to structure the static or rest position of the associated cross-tie of the cross-tie, Bloch-line pair.

DESCRIPTION OF THE PREFERRED EMBODIMENT

Figure 1:
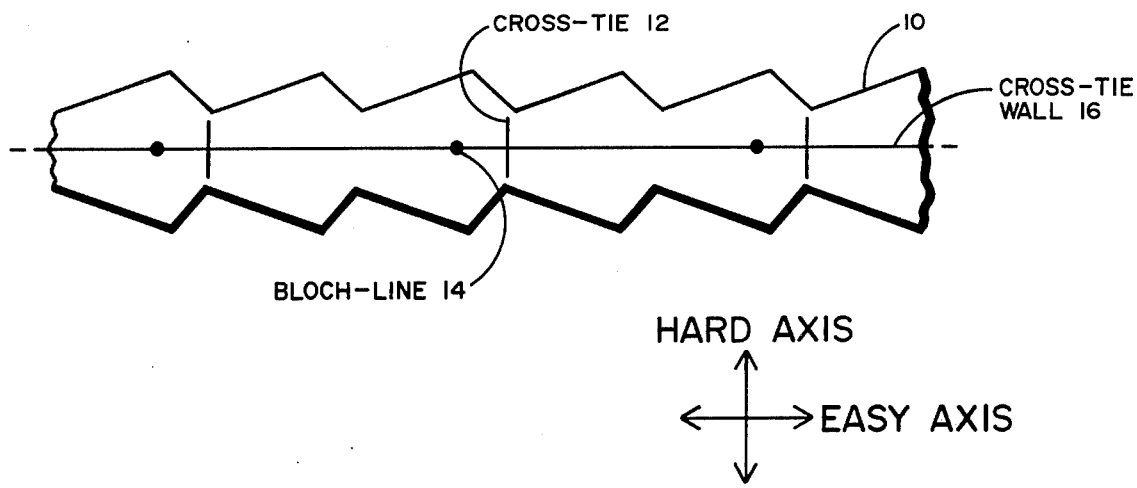
FIG. 1 is a schematic illustration of a prior art serrated film strip that defines the data track of a cross-tie wall memory system.

Illustrated in FIG. 1 is a serrated strip 10, of a ferromagnetic film 350 Angstroms (A) thick of approximately 81% Ni - 19% Fe, that has been proposed for use in a cross-tie memory system—see the hereinabove discussed L. J. Schwee, et al, AIP publication. The object of the serrated film strip is to produce a cross-tie 12, Bloch-line 14 data track with potential wells that are uniformly spaced along the data track for confining the cross-tie, Block-line pairs at specified or structured intervals or positions along the cross-tie wall 16. Basically, the magnetic characteristics of film strip 10 depend upon the magnetic free poles along the edges of the serrated boundaries.

Figure 2:
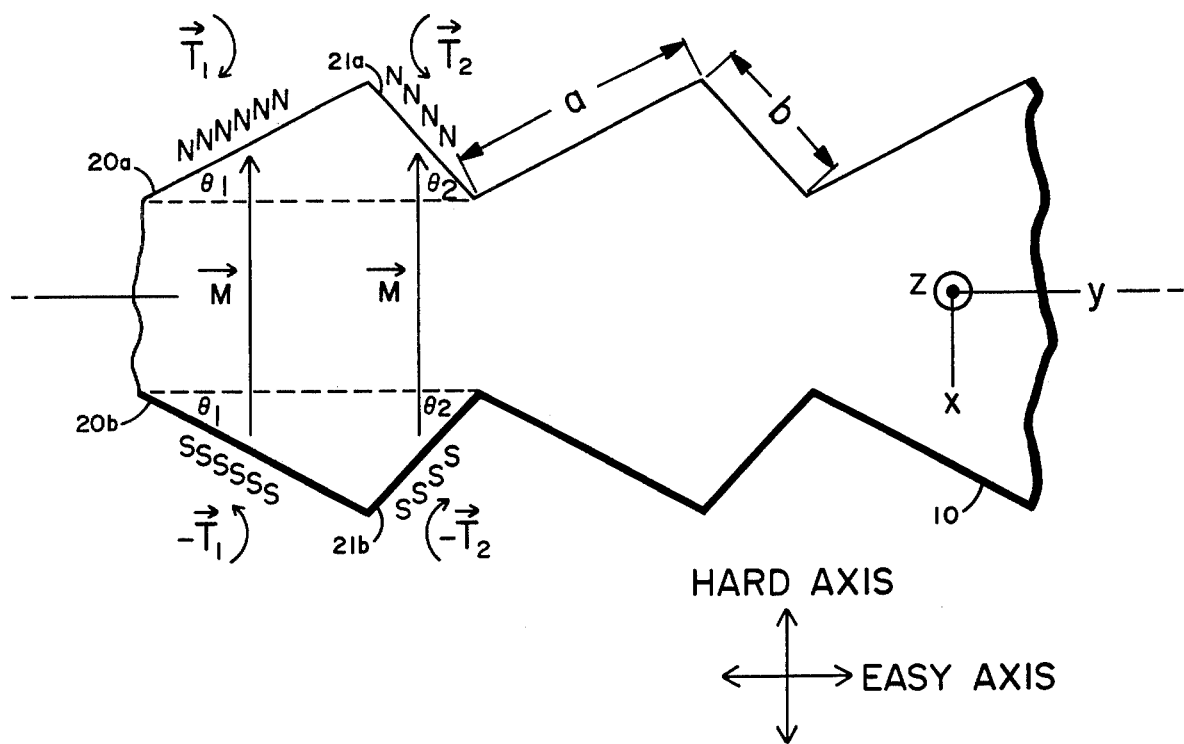
FIG. 2 is a schematic illustration of the magnetization M orientation and the edge geometry parameters associated with the serrated edge geometry of the film strip of FIG. 1.

As illustrated in FIG. 2, when the magnetization M is oriented upwardly in the plane of the drawing along the hard axis, as by applying a hard axis magnetic field much greater than the anisotropy field $H_k$, a torque acts upon the magnetization M in the upper half of the serrated strips, above the cross-tie wall 16, as described by the following torque equation:

$$\vec{T} = \vec{T}_1 - \vec{T}_2 = -\hat{z} k_1 \cos \theta_1 \sin \theta_1 + \hat{z} k_2 \cos \theta_2 \sin \theta_2$$

where: $\vec{T}_1$ and $\vec{T}_2$ are torques resulting from the magnetic free poles proportional to $\cos \phi_1$ and $\cos \phi_2$ along the left and right, straight, angular serrated edges, 20a, 20b and 21a, 21b, respectively. $\sin \phi_1$ and $\sin \phi_2$ arise from the cross product of the magnetization M and the demagnetizing field in the torque formula; $k_1$ and $k_2$ are constants depending upon the magnetization M and the volume of the magneic material of which the film strip is fabricated. Since the magnetization M and the thickness of the film strip are the same for the entire film layer, $k_1$ and $k_2$ are proportional only to the length of the serrated edges $a$ and $b$. Assume that it is desired to have net torque acting on the clockwise (cw) direction (i.e., $-z$ direction). The values of $\phi_1$, $\phi_2$, $a$ and $b$ should be selected so as to satisfy the torque equation. An illustration shown in FIG. 3 where $\phi_1 = 21°, \phi_2 = 51°, a = 5.5,$ and $b = 2.5$ (in arbitrary units of length), a net cw torque proportional to:

$$-\hat{z} 5.5 \cos 21° \sin 21° + \hat{z} 2.5 \cos 51° \sin 51° = -\hat{z} 0.62$$

will result. This torque will then steer the magnetization M in a clockwise direction in the upper portion of the film strip toward the $y$ direction. At the same time, because of symmetry, a net counterclockwise (ccw) steering torque will act on the magnetization M in the lower portion of the film strip. Therefore, after removal of the applied hard axis field, the magnetization M will orient along the $+y$ direction and the $-y$ direction, respectively, for the upper and lower halves of the serrated film strip. A magnetic domain wall or cross-tie wall for a cross-tie, Bloch-line data track will then be formed along the geometric centerline of the film strip.

Figure 3:
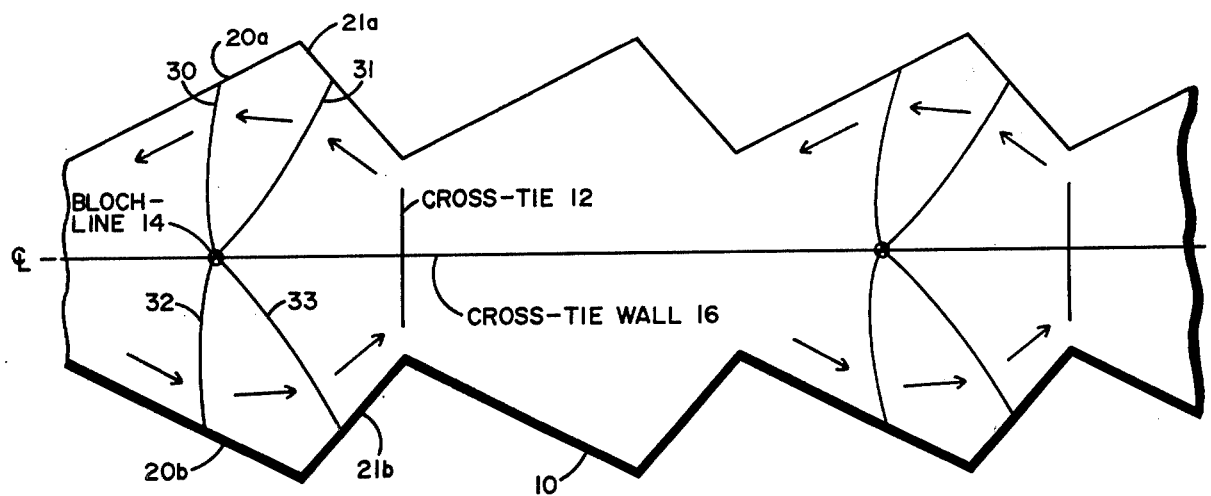
FIG. 3 is a schematic illustrated of a cross-tie, Bloch-line pair positioned along the cross-tie wall of the serrated film strip of FIG. 1 and the deleterious magnetic domain walls that extend from the sharp angular edges of the serrated film strip in toward the associated Block-line.
Figure 4:
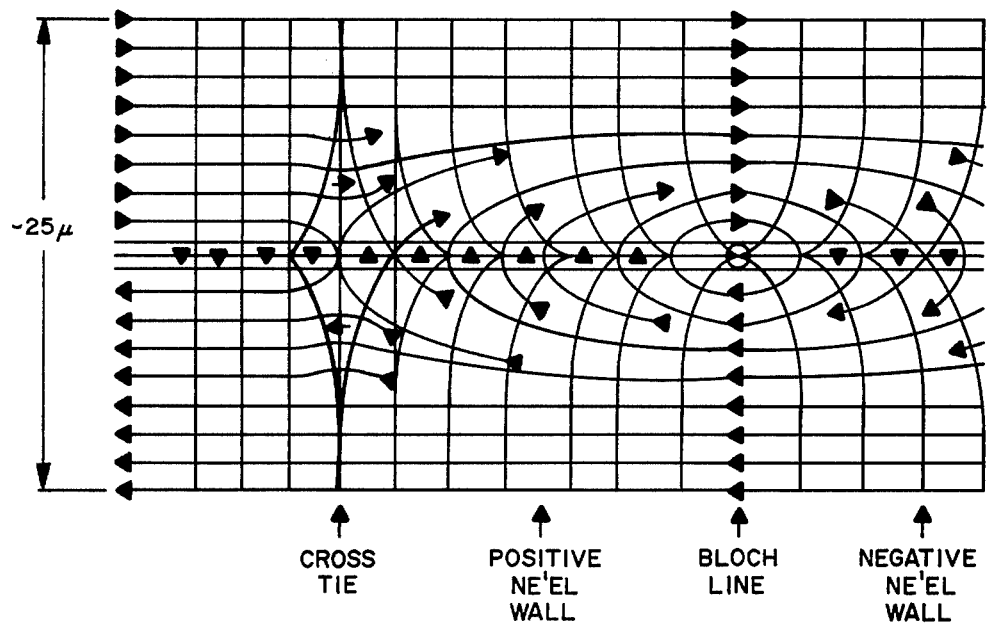
FIG. 4 is an illustration of the idealized magnetization M distribution about an idealized cross-tie wall.

However, examination of the magnetization M distribution in FIG. 3 reveals differences from that of an idealized cross-tie wall as shown in FIG. 4. The magnetization M in FIG. 3 is confined to follow the contour of the straight, angular serrated edge in order to avoid the formation of free poles and to minimize the total energy. Thus, this forced confinement of the magnetization M at the straight, angular serrated edges of the film strip 10 creates abrupt changes in magnetization distribution as shown by the lines 30, 31, 32, 33 (magnetic walls) that extend from the serrated edges 20a, 21a, 20b, 21b, respectively, toward the Bloch-line 14 that is positioned along the cross-tie wall 16 at the geometric centerline of the film strip 10. Experimental data discussed hereinabove referenced in the L. J. Schwee, et al, AIP publication indicate that a larger transverse field is required to move a cross-tie, Bloch-line pair along a serrated film strip data track than is required in large unetched films because of the potential wells and demagnetizing effects produced by the straight, angular serrated edge conformation of the film strip 10 of FIG. 1.

Figure 5:
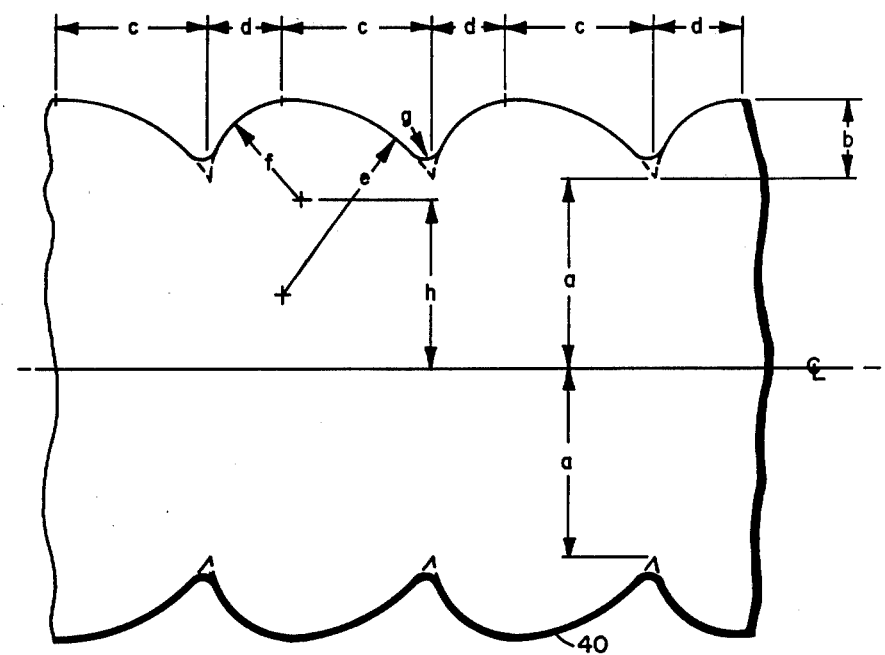
FIG. 5 is a plan view of a portion of a typical serrated film strip having the rounded, asymmetrical edge geometry of the present invention.
Figure 6:
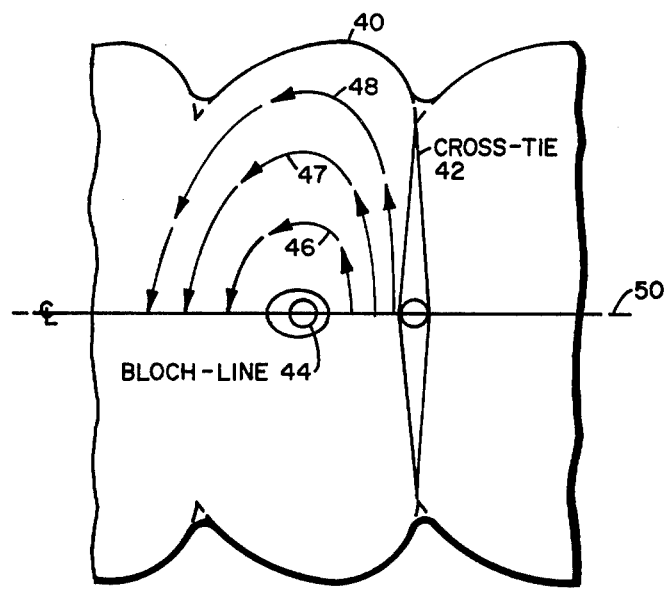
FIG. 6 is a schematic illustration of the manner in which the rounded, asymmetrical edge contour of the present invention substantially follows the natural magnetization M distribution of the cross-tie wall in the area of a Block-line.

It is apparent that some asymmetry (i.e., $a \neq b$ in FIG. 2) is required along the serrated edge of the film strip to ensure the existence of a steering torque for the formation of a cross-tie wall along the centerline of the film strip. At the same time, it is also desirable to have the serrated edges follow the natural magnetization distribution of the cross-tie wall as closely as possible. Using these criteria, a ferrogmagnetic film strip 40 incorporating the present invention and having smoothly round edges with a very slight difference between the dimensions a and b (see FIG. 2) i.e., asymmetry, is illustrated in FIG. 5 and has the typical dimensions according to Table A. The resulting theoretical magnetization M distribution is schematically illustrated in FIG. 6. FIG. 6 illustrates that the natural magnetization distribution about the cross-tie 42, Bloch-line 44 pair, as illustrated by lines 46, 47, 48, is asymmetrical about the geometric centerline 50 of and generally follows the rounded edge contour of film strip 40. The previously observed abrupt magnetic variations, i.e., domain walls, represented by, e.g., lines 30, 31, 32, 33 that extend from the straight angular edges of film strip 10 toward the Block-line 14 of FIGS. 1, 3 are eliminated in the design of FIG. 5. The effect of the film strip 40 rounded edge geometry on cross-tie 42, Bloch-line 44 pair mobility along the cross-tie wall, represented by the geometric centerline 50, and upon the other operating characteristics of a cross-tie wall memory system incorporating the present invention are of a substantial improvement over the prior art design of FIGS. 1, 2.

TABLE A

| PARAMETER | FILM STRIP 40a | FILM STRIP 40b | FILM STRIP 40c |
| --- | --- | --- | --- |
| a | 10 μm | 6 μm | 6 μm |
| b | 4 μm | 4 μm | 4 μm |
| c | 8 μm | 6 μm | 8 μm |
| d | 4 μm | 4 μm | 4 μm |
| e | 10 μm | 6 μm | 10 μm |
| f | 5 μm | 4 μm | 5 μm |
| g | 1 μm | 1 μm | 1 μm |

What is claimed is:

1. In a cross-tie wall memory system in which binary data are stored as inverted Néel wall sections, which inverted Néel wall sections are bounded by a cross-tie on one end and by a Bloch-line on the other end, of a cross-tie wall in a magnetic layer and in which said binary data are generated in and are serially propagated along said cross-tie wall by appropriate drive fields, the improvement in which said magnetic layer is configured into a strip whose two opposing edges are formed into uniformly spaced, repetitive patterns of asymmetrically rounded, serrated edges that match the natural contour of the magnetization that is oriented around a Bloch-line that is positioned along said cross-tie wall.

2. In a cross-tie wall memory system in which binary data are stored as inverted Néel wall sections, which inverted Néel wall sections are bounded by a cross-tie on one end and by a Bloch-line on the other end, of a cross-tie wall in a magnetic layer and in which said binary data are generated in and are serially propagated along said cross-tie wall by appropriate drive fields, the improvement in which said magnetic layer is configured into a strip whose two opposing edges are formed about the geometric centerline of the strip for orienting the natural contour of the magnetization that is oriented around a Bloch-line that is positioned along said cross-tie wall in substantial alignment with the opposing asymmetrical rounded, serrated edges that are associated with said Block-line.

3. In a cross-tie wall memory system in which binary data are stored as inverted Néel wall sections, which inverted Néel wall sections are bounded by a cross-tie on one end and by a Bloch-line on the other end, of a cross-tie wall in a magnetic layer and in which said binary data are generated in and are serially propagated along said cross-tie wall by appropriate drive fields, the improvement in which said magnetic layer is configured into a strip whose two opposing edges are formed into uniformly spaced, repetitive patterns of asymmetrically rounded, serrated edges that are formed about the geometric centerline of the strip for establishing a cross-tie wall along said geometric centerline, structuring cross-tie, Bloch-line pairs along said cross-tie wall and orienting around a Bloch-line that is positioned along said cross-tie wall in substantial alignment with the opposing asymmetrical rounded, serrated edges that are associated with said Bloch-line.

* * * * *